Sept. 5, 1967 J. G. CAMPBELL 3,340,345

MOUNTING FOR SEMICONDUCTOR DEVICES

Filed March 18, 1965

INVENTOR
John G. Campbell

BY [signature]

ATTORNEY 3,340,345
Patented Sept. 5, 1967

3,340,345

MOUNTING FOR SEMICONDUCTOR DEVICES

John G. Campbell, 609 Lakeside Drive,
Irving, Tex. 75060

Filed Mar. 18, 1965, Ser. No. 440,746
9 Claims. (Cl. 174—15)

The present invention relates to a structure for mounting semiconductor devices to a chassis and more particularly to a mounting especially adapted for use with TO type cases.

Many semiconductor devices, and particularly transistors, are packaged in what are commonly referred to as TO type cases. A TO type case is one in which the leads of the device contained within the case pass downward and out through a header which comprises the base of the case. The can which forms the main portion of the case is formed with an outwardly extending flange at its open end and is attached by the flange to the header in sealing relationship. In some instances, the leads passing through the header are insulated by glass beads. In other instances, a portion of the device, for example the collector of the transistor, may be connected directly to the header with the pin utilized for making connection to that portion being electrically connected to the header.

One of the limiting factors upon operation of transistors is the amount of heat that can be dissipated. Thus, at any desired operating level, the junction temperature will be dependent upon the ambient temperature and the amount of heat that can be dissipated by the transistor structure. If the juncture temperature becomes excessive, thermal run away will occur, resulting in either destruction of the transistor or improper operating of the circuit of which the transistor forms a part. It will therefore be seen that if the amount of heat dissipated by the transistor for any predetermined ambient temperature is increased, the power level at which the transistor is operated can also be increased.

Efforts have been made to increase the heat dissipation and thereby increase the power level at which a transistor can be operated. Accordingly, several types of heat sinks have geen proposed. However, in general, these prior art structures have resulted in an increase in the interelectrode capacitance of the device, adversely affecting operation of the device at higher frequencies to a substantial extent.

The present invention provides an improved mounting for a semiconductor device, such as a transistor, contained within a TO type case, resulting in improved heat dissipation without a substantial adverse effect upon the interelectrode capacitance of the device. The mounting of the present invention is especially adapted for use in mounting a transistor positioned within a TO type can to a conventional transistor socket.

Thus, in accordance with the present invention, there is provided a base member having a high coefficient of thermal conductivity having a centrally disposed opening for receiving the leads of the device. Suitably, the opening in the base member is of a size to receive the portion of the socket which projects above the mounting plate. This first member is preferably of an electrically conductive material, since electrically conductive materials normally have a higher coefficient of thermal conductivity than insulating materials. The first mentioned member is suitably formed of copper. There is also provided a plate member of insulating material, suitably a ceramic, adapted to overlay the first member and the socket. Aperatures are formed in the plate member for receiving the leads which project downwardly from the header. A deformable member, suitably of a plastic material such as Teflon, is also provided. The deformable member is provided with a centrally disposed aperture which conforms to the shape and size of the can portion of the case, the aperture being smaller than the flange portion of the can. Commonly aligned holes adapted to receive screws for connecting the deformable member, insulating member and base member into a unitary structure with the flange of the case held between the deformable member and the insulating plate member with the leads of the transistor case passing through apertures formed in the insulating member and extending into the opening found in the base member.

Many objects and advantages of the invention will become readily apparent to those skilled in the art as the following detailed description of a preferred embodiment of the same unfolds when taken in conjunction with the appended drawing wherein like reference numerals denote like parts and in which.

Figure 1:
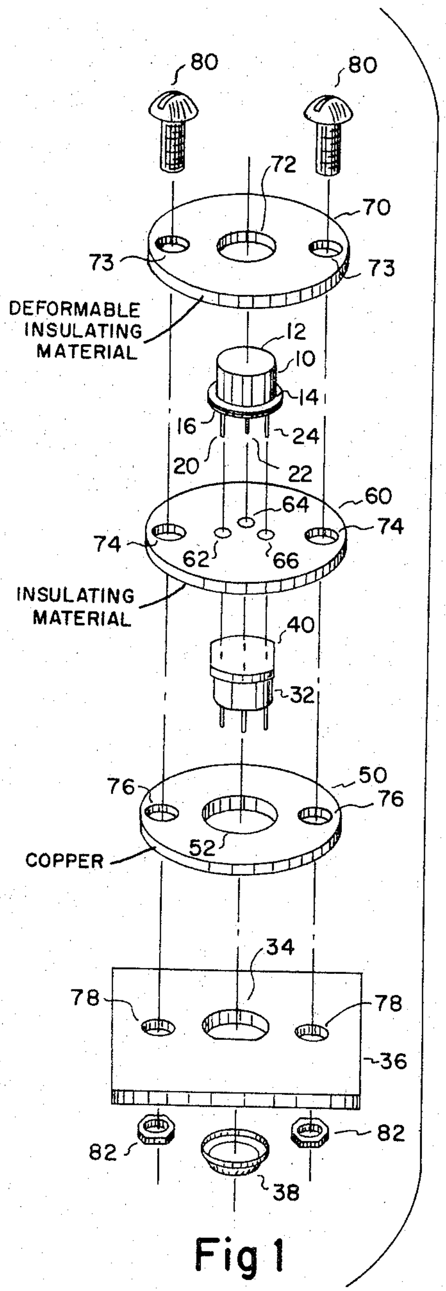
FIGURE 1 is an expanded prospective view showing the parts utilized in mounting a transistor in accordance with a preferred embodiment of the present invention.
Figure 2:
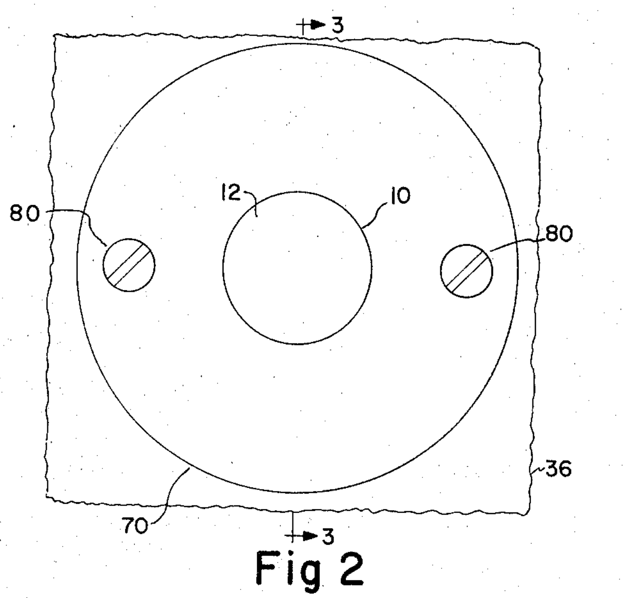
FIGURE 2 is a plan view showing a transistor mounted in accordance with the present invention.

Turning now to the drawing, there is shown a transistor 10 packaged in a TO case. The case of the transistor 10 includes a can portion 12 terminated at its open end in an outwardly extending, peripheral flange 14. The can 12 is connected to a header 16 by its flange portion 14 to define a sealed compartment which encloses a die 18 of semiconductor material. In the form shown, junctions are formed therein to define a transistor structure. The header 16 is provided with leads 20, 22, and 24 which are electrically connected to the collector 26, base 28 and emitter 30 of the transistor, respectively.

There is also suitably provided a conventional transistor socket 32 adapted to be received in opening 34 formed in chassis plate 36. It will be observed that the transistor socket 32 includes an enlarged upper portion 40 which defines a flange adapted to engage the upper surface of the plate 36. When the socket 32 is inserted into the hole 34, the socket is held in place by the flange portion 40 and the retaining ring 38.

In accordance with conventional usage, the transistor 10 would be mounted to the chassis 36 by the socket 32. The socket 32 is conventionally of an insulating material having a relatively low coefficient of thermal conductivity. The chassis 36 does not, therefore, function as an efficient heat sink since it is not in good thermal contact with the heat generating portions of the semiconductor die 18.

In accordance with the present invention, there is provided a base member 50 which is suitably formed of copper or similar material having a high coefficient of thermal conductivity. The member 50 is suitably of annular configuration and includes an opening 52 defined therein adapted to receive the flange portion 40 of the socket 32. The thickness of the base member 50 is at least equal to and suitably somewhat greater than the thickness of the flange portion 40 of the socket 32.

There is also provided a plate member 60 formed of insulating material having a high coefficient of thermal conductivity, suitably a ceramic material such as alumina. The insulating plate member 60 is formed with a plurality of apertures 62, 64 and 66 defined therein. Apertures 62, 64 and 66 are of a size and arrangement to receive the leads 20, 22 and 24, respectively, which extend from the header 16 of the transistor 10.

There is also provided a deformable member 70, preferably formed of tetraofluoroethylene, commercially available under the trademark Teflon. The member 70 is suitably of annular configuration, with the centrally disposed aperture 72 being of the same size and configuration as the can portion 12 of the transistor 10. The base member 50, the insulating plate member 60 and the deformable member 70 are each suitably formed with pairs of holes 73, 74 and 76, respectively, which align with the pair of holes 78 formed in the chassis plate 36. The holes 73, 74, 76 and 78 are adapted to receive the screws 80 which extend therethrough.

When nuts 82 are tightened onto the screws 80, there is defined a unitary structure comprising the base member 50, the insulating plate member 60, and the deformable member 70. The base member 50 and the lower surface 84 of the insulating plate member 60 define an open ended compartment 86 adapted to receive the portion of the transistor socket 32 which extends above the chassis plate 36. The deformable member 70 and the upper surface 88 of the insulating plate member 60 define a second compartment 90 adapted to receive the lower portion of the transistor 10 with the transistor 10 being held in place with its leads extending through the apertures formed in the insulating plate member 60 with the can portion 10 projecting from the compartment 90 but the flanges being enclosed therein for holding the transistor 10 in place.

Figure 3:
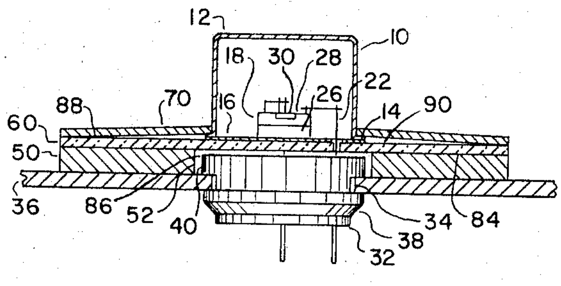
FIGURE 3 is a cross sectional view taken along line 3—3 of FIGURE 2.

As best seen in FIGURE 3, the die 18 of the transistor 10 is suitably in intimate thermal contact with the header 16. Similarly, the header 16 is in intimate thermal contact with the insulating plate member 60, which in turn is in intimate thermal contact with the base member 50. An excellent path for conducting heat from the die 18 to the heat sink defined by the chassis plate 36 is thereby provided. The amount of heat which is dissipated is increased substantially with a resultant increase in the power level at which the transistor 10 can be operated. It will be observed, moreover, that due to the arrangement of the parts, the interelectrode capacitance is effectively reduced by the structure of the present invention rather than being increased as is true in most prior art structures proposed for achieving better heat dissipation. It is therefore practical to use the principles of the present invention with transistors which are operated at very high frequencies.

Although the invention has been described with regard to a particular preferred embodiment, many changes and modifications will become obvious to those skilled in the art. The foregoing description is therefore intended to be illustrative and not limiting of the invention defined in the appended claims.

What I claim is:

1. Mounting means for a circuit element packaged in a case having a peripheral flange and leads projecting from the lower surface thereof, said means functioning to mount said circuit element onto a heat conductive structural member, wherein an insulative, low heat conductive, socket-like member is disposed on said structural member for receiving said leads, said mounting means comprising:

(a) a base member of high thermal conductivity for positioning on said structural member, the base member having an opening corresponding in cross section to said socket-like member, (b) a thin electrically nonconductive plate member of good thermal conductivity positioned over the base member, the plate member being apertured whereby the leads of the circuit element may pass through to engage the socket-like member, (c) a deformable sheet member for overlying the plate member and having an aperture member smaller than the peripheral flange whereby the sheet member when fitted over the case will hold the flange against the plate member, and (d) means for securing the base member and the plate member to the structural member and for securing the sheet member to the plate member.

2. Mounting means for a circuit element encased in a TO type case having a peripheral flange and leads projecting from the lower surface thereof comprising:

(a) an annular copper base member having a centrally disposed opening formed therein;

(b) a plate member formed of alumina positioned over said base member having a plurality of apertures formed therein, said apertures being positioned over the opening formed in said base member; and (c) a deformable sheet member of an insulating plastic material overlying said insulating member and having an opening formed therein axially aligned with the opening formed in said base member;

(d) each of said base member, said plate member and said sheet member having a pair of oppositely disposed holes formed therein and aligned for commonly receiving a screw for connecting said base member, said plate member, and said sheet member into a unitary structure adapted to embrace the flange of a TO case between the plate member and the sheet member with the body of the case extending out of the opening formed in the sheet member and the leads extending through the apertures of the plate member into the opening formed in the annular base member.

3. Mounting means as defined in claim 2 further including a socket means having apertures adapted to receive said leads extending into the opening formed in said base member, said socket means further including a flange portion of a thickness less than the thickness of said annular base member extending into the opening formed in said base member.

4. In combination:

(a) a semiconductor device encased within a TO type case having a peripheral flange at its lower end with a group of leads connected to the device extending from the bottom of said case and a can portion enclosing said device and extending upwardly from said flange;

(b) socket means adapted to receive said leads and having an enlarged flange portion and a body portion;

(c) a chassis plate on which said socket is mounted;

(d) said chassis plate including a cut out portion into which the body of said socket extends with the flange portion extending above the surface of said chassis plate;

(e) a base member having an opening formed therein, said base member being of a thickness at least equal to the thickness of the flange portion of said socket means, the flange portion of said socket means being received within the opening of said base portion;

(f) an insulating plate member positioned over said base member and having a group of apertures formed therein, said apertures opening into the opening formed in said base member being on common centers with the leads extending from the bottom of said case whereby said leads extend through said apertures into said socket member with the bottom surface of said case in intimate thermal contact with said insulating plate member;

(g) a sheet of deformable material overlying said insulating plate member and having an opening formed therein of substantially the same shape as the can portion of said case in cross section whereby the can portion of said case extends through said opening with said flexible sheet member engaging the flange portion of said case; and (h) means for connecting said flexible member, said insulating plate member, said base member and said chassis plate into a unitary structure whereby said device is held in position with the leads of said device extending into said socket member and the semiconductor device enclosed within said case is in intimate thermal contact with said chassis.

5. A combination as defined in claim 4 wherein the opening formed in said base member is at least as large as said TO case to thereby reduce the interelectrode capacitance between said device and said chassis.

6. A combination as defined in claim 4 wherein said base member is of annular configuration and formed of copper.

7. A combination as defined in claim 4 wherein said insulating plate member is formed of ceramic material.

8. A combination as defined in claim 4 wherein said insulating plate member is formed of alumina.

9. A combination as defined in claim 9 wherein said flexible member is formed of an insulating plastic material.

References Cited

UNITED STATES PATENTS

| | | | |
|---|---|---|---|
| 3,152,293 | 10/1964 | Ruben | 165—185 X |
| 3,209,065 | 9/1965 | Steiner | 174—52 |
| 3,261,904 | 7/1966 | Wulc | 174—15 |
| 3,265,802 | 8/1966 | Hillman et al. | 317—234 X |

LEWIS H. MYERS, *Primary Examiner.*

H. HUBERFELD, J. F. RUGGIERO, *Assistant Examiners.*